United States Patent
Milner et al.

(10) Patent No.: US 11,787,000 B2
(45) Date of Patent: Oct. 17, 2023

(54) METHOD FOR GRIPPING VARIABLE THICKNESS WORKPIECES IN A PRINTING MACHINE

(71) Applicant: ASMPT SMT SINGAPORE PTE. LTD., Singapore (SG)

(72) Inventors: Andrew Mark Milner, Weymouth (GB); Anthony Cheeseman, Weymouth (GB); Michael Westlake, Weymouth (GB)

(73) Assignee: ASMPT SMT SINGAPORE PTE. LTD., Singapore (SG)

( * ) Notice: Subject to any disclaimer, the term of this patent is extended or adjusted under 35 U.S.C. 154(b) by 90 days.

(21) Appl. No.: 17/495,859

(22) Filed: Oct. 7, 2021

(65) Prior Publication Data

US 2022/0126566 A1 Apr. 28, 2022

(30) Foreign Application Priority Data

Oct. 26, 2020 (GB) ...................................... 2016914

(51) Int. Cl.
| | |
|---|---|
| B41M 1/12 | (2006.01) |
| B41F 15/26 | (2006.01) |
| B23Q 3/06 | (2006.01) |
| B25B 5/14 | (2006.01) |
| H01L 21/677 | (2006.01) |
| B41F 15/36 | (2006.01) |

(52) U.S. Cl.
CPC ............... *B23Q 3/062* (2013.01); *B25B 5/14* (2013.01); *B25B 5/145* (2013.01); *B41F 15/36* (2013.01); *H01L 21/677* (2013.01)

(58) Field of Classification Search
None
See application file for complete search history.

(56) References Cited

U.S. PATENT DOCUMENTS

| | | | |
|---|---|---|---|
| 6,726,195 B1 | 4/2004 | Hertz et al. | ........... 269/266 |
| 2005/0041851 A1 | 2/2005 | McEvoy et al. | |
| 2005/0155501 A1* | 7/2005 | Sakaue | ........... B41F 15/26 |
| | | | 101/126 |

FOREIGN PATENT DOCUMENTS

| | | |
|---|---|---|
| CN | 101479108 A | 7/2009 |
| CN | 103879130 A | 6/2014 |
| CN | 111093996 A | 5/2020 |
| EP | 2033780 A1 | 3/2009 |
| EP | 2747530 A1 | 6/2014 |

(Continued)

OTHER PUBLICATIONS

English language translation of JP 2013-116584 A (Chiga), publication date Jun. 13, 2013. (Year: 2013).*

(Continued)

*Primary Examiner* — Leslie J Evanisko
(74) *Attorney, Agent, or Firm* — OSTROLENK FABER LLP (57) ABSTRACT

A method of gripping a substantially planar workpiece while providing compensation for variations in thickness is described. During the process, the workpiece is overdriven into a clamping member before clamping force is applied, and the positions of the clamping member before and after application of the clamping force are measured. These measurements are then used to control a compensating movement of the tooling table and optionally a final lift of the conveyance rails.

13 Claims, 9 Drawing Sheets

(56) References Cited

FOREIGN PATENT DOCUMENTS

| EP | 3680105 A1 | | 7/2020 | |
|----|----|----|----|----|
| JP | H10-296948 A | | 11/1998 | |
| JP | 2006-289817 A | | 10/2006 | |
| JP | 2013116584 A | * | 6/2013 | |
| WO | WO-2017022109 A1 | * | 2/2017 | ............. B41F 15/08 |

OTHER PUBLICATIONS

English language translation of WO 2017-022109 A1 (Hirukawa et al.), publication date Aug. 5, 2015. (Year: 2015).*

* cited by examiner

METHOD FOR GRIPPING VARIABLE THICKNESS WORKPIECES IN A PRINTING MACHINE

This invention relates to a method of gripping a substantially workpiece and a printing machine for applying print medium to a substantially planar workpiece in a printing operation.

BACKGROUND AND PRIOR ART

Industrial screen-printing machines typically apply a conductive print medium, such as solder paste, silver paste or conductive ink, onto a planar workpiece, such as a circuit board, by applying the conductive print medium through a pattern of apertures in a tensioned printing screen (sometimes referred to as a mask or stencil) using an angled blade or squeegee. The same machines may also be used to print certain non-conductive media, such as glue or other adhesive, onto workpieces.

In order to secure the workpiece and minimise movement during printing, the workpiece may be 'top clamped' such that its front and rear edges are gripped by spring steel foils incorporated into top plates within the conveyor system. Normally, pneumatic cylinders are employed to locally actuate the top plates downwards onto the top of the workpiece, with electronic pressure regulation employed to control the clamp pressure applied thereto.

The workpiece is then driven upwards to a print height, such that the workpiece contacts the underside of the printing screen, and a printing operation in which print medium is applied to the workpiece via the printing screen may then commence.

However, a problem exists with such known systems in that variations in workpiece thickness may adversely affect the printing process. By way of example, board suppliers typically quote ±10% variation about a nominal thickness due to manufacturing tolerances. Workpieces which are thinner than this nominal thickness will likely end up at a vertical position slightly below the optimum print height, creating what is commonly known as a "print gap". Workpieces which are thicker than the nominal thickness will likely end up at a vertical position slightly above the optimum print height, creating what is commonly known as a "negative print gap". Generally, the presence of a "negative print gap" is preferable to a print gap, since with a negative print gap there is at least contact between the workpiece and the printing screen. However, there are limits to how large a negative print gap can be used without adversely affecting print quality and yield, and potentially causing damage to at least one of the workpiece and the printing screen.

Small variations in workpiece thickness may be absorbed using an offset to encourage negative print gap, whereby the workpiece is overdriven into the stencil by a small amount to ensure a gasket is formed between the underside of the printing screen and the upper surface (known as the "topside") of the workpiece. For example, a nominal workpiece thickness of 1.0 mm would only be subject to a variation of ±0.1 mm, which would likely be accommodated using such a negative print gap.

As the nominal workpiece thickness increases however, the amount of variation increases since the tolerance is quoted in percentage terms. For example a nominal workpiece thickness of 6.0 mm would be subject to a relatively large variation of ±0.6 mm, which variation cannot be accommodated using a negative print gap.

Large variations in workpiece thickness may therefore result in poor control over the print gap, which in turn leads to poor yield.

The present invention seeks to address this problem and so enable a printing process which can adapt to workpieces of varying thickness.

In accordance with the present invention this aim is achieved by adapting a conventional workpiece clamping process to include an "overdriving" step, controlled through measurement of the relative heights of clamping and rail brackets during the clamping process.

SUMMARY OF THE INVENTION

In accordance with a first aspect of the present invention there is provided a method of gripping a substantially planar workpiece, comprising the steps of:
i) providing a workpiece support and gripping assembly including the following components:
   tooling comprising a tooling table and at least one engagement member, the at least one engagement member having an upper surface adapted to support the underside of a workpiece,
   first and second rails comprising respective first and second conveyors for receiving a workpiece from a transport system, and
   first and second clamping brackets comprising respective first and second contact edges for applying gripping force to the workpiece,
   all of these components being vertically moveable with respect to the other components;
ii) locating the workpiece on the first and second conveyors with the tooling therebelow;
iii) raising the tooling table such that the workpiece is lifted off the conveyors and into contact with an underside of the contact edge; and
iv) applying a gripping downward force to the workpiece via the first and second contact edges,
   wherein in step iii), following contacting of the workpiece and the contact edge, the tooling table is overdriven in an upwards direction to lift the clamping brackets away from the rails.

In accordance with a second aspect of the present invention there is provided a printing machine for performing the method of the first aspect.

In accordance with a third aspect of the present invention there is provided a printing machine for applying print medium to a substantially planar workpiece in a printing operation, the workpiece having first and second mutually opposed major surfaces, the first major surface facing upwardly and the second major surface facing downwardly in use, the printing machine comprising a rail unit for transporting the workpiece within the printing machine, comprising:
   first and second clamping brackets comprising respective first and second contact edges for contacting the first major surface of the workpiece in use and a top plate including a substantially planar upper surface arranged in a horizontal X-Y plane for contacting the underside of a printing screen in use,
   first and second rails comprising respective first and second conveyors for receiving a workpiece from a transport system in use,
   a tooling table for supporting a tooling engagement member thereon in use, a Z-axis actuator operative to move the first and second clamping brackets relative to the first and second rails along a Z-axis orthogonal to the X-Y plane, and a measurement device for measuring the position along the Z-axis of the first and second clamping brackets relative to the first and second rails.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

As noted above, FIGS. 1 to 8 schematically show, in sectional side view taken in the Y-Z plane, a sequence of steps in a top-clamping process according to an embodiment of the present invention.

i) Initial Set-Up

Figure 1:
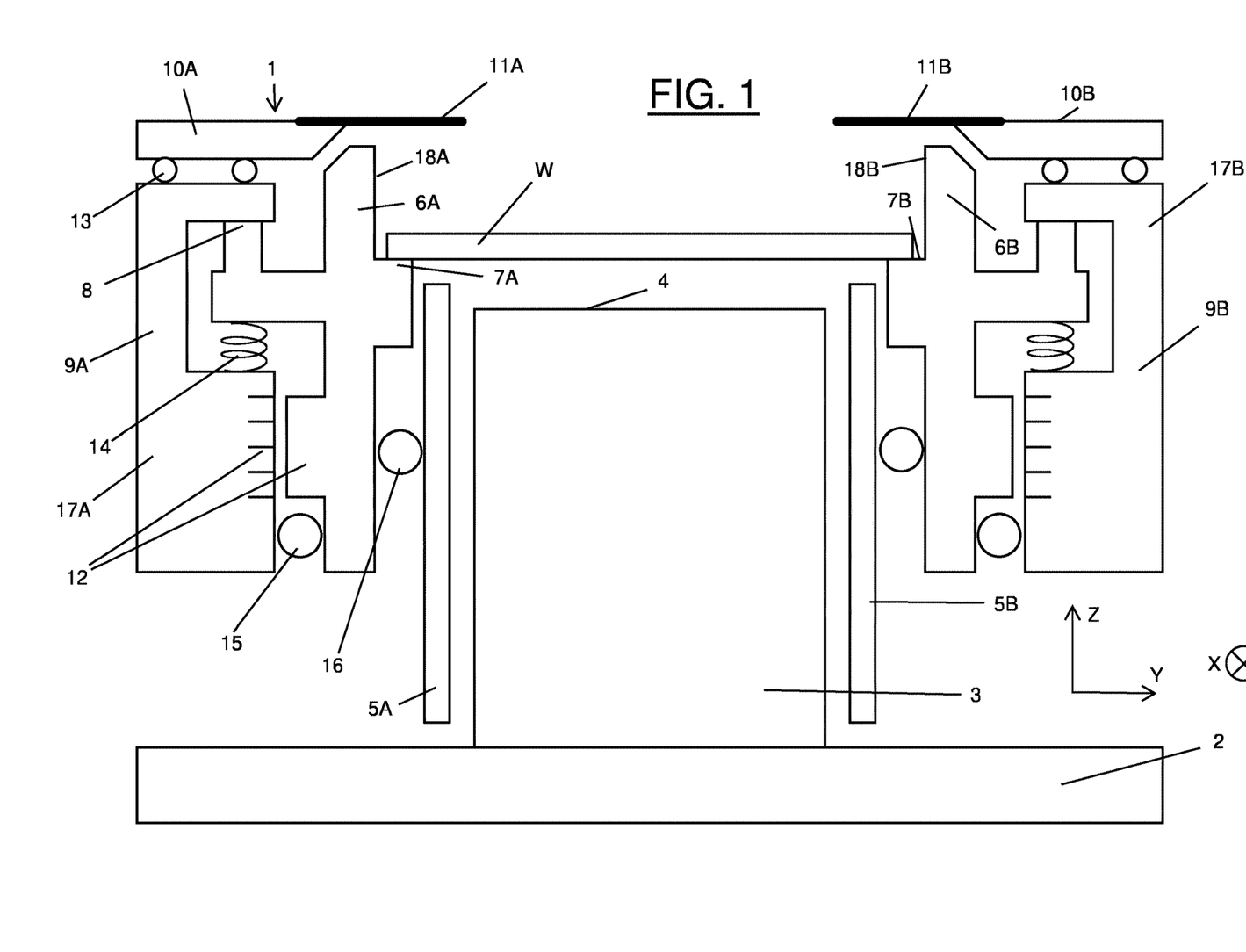
FIGS. 1 to 8 schematically show, in sectional side view taken in the Y-Z plane, a sequence of steps in a top-clamping process according to an embodiment of the present invention.
Figure 9:
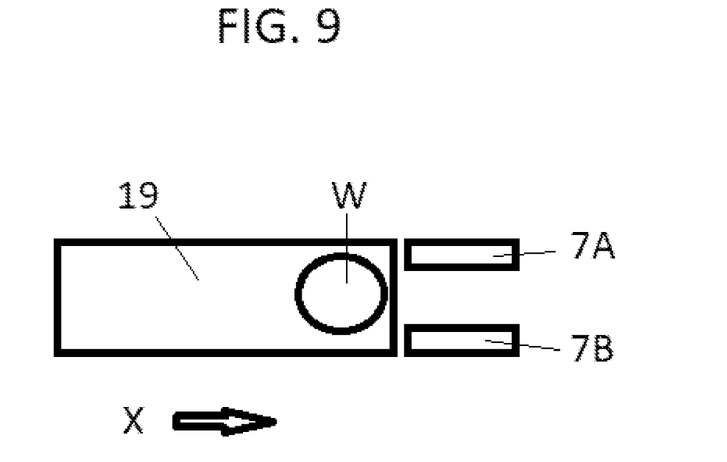
FIG. 9 schematically shows the first and second conveyors receiving a workpiece from a transport system.

Looking firstly at FIG. 1, a workpiece support and gripping assembly 1 is shown which, for the sake of example only, could be located within a printing machine (with the bulk of the printing machine not visible). The workpiece W shown is substantially planar, and may for example comprise a circuit board or wafer. In this embodiment, the workpiece support and gripping assembly 1 includes the following components:

i) tooling comprising a tooling table 2 which is driveable in the vertical (Z direction), is located below the workpiece W and has a flat upper surface. The tooling also includes at least one engagement member 3 with an upper surface 4 adapted to support the underside of a workpiece W. As shown, the engagement member 3 comprises a tooling block, a monolithic block whose upper surface 4 may be profiled so that any projecting pieces on the underside of workpiece W, such as previously-placed electronics components (not shown) for example, may be received within appropriately sized and shaped depressions within the tooling block to avoid being damaged during subsequent operations. As is known in the art, there are various types of engagement member which may be located on a tooling table 2, such as, for example, a plurality of tooling pins, or a matrix array of height adjustable pins (such as Applicant's "GridLok" system). In this embodiment, the tooling also comprises first and second support brackets 5A, 5B which, as will be described in more detail below, act as clamping plates and engage directly with lateral edge portions of the workpiece W. Depending on the design of the engagement member 3 and the other components described below, these support brackets 5A, 5B may be optional, for example if the engagement member 3 has an upper edge surface that is sufficiently close to the lateral edges of the workpiece W so that it may be suitably clamped thereto;

ii) first and second rails 6A, 6B comprising respective first and second conveyors 7A, 7B for receiving the workpiece W from an input portion of a transport system 19 (FIG. 9), such as a transport conveyor which translates workpieces to a printing area in a printing machine in the X direction shown, as is well-known in the art per se. The conveyors 7A, 7B may for example comprise belts or rollers, and are operative to receive a workpiece W thereon from the transport system, position the workpiece W over the tooling and, subsequent to completion of a printing operation, move the printed workpiece W onto an exit portion of the transport system, again in the X direction shown. The first and second rails 6A, 6B include hard stops 8 which physically delimit the minimum distance in the vertical or Z direction shown between the first and second rails 6A, 6B and respective first and second clamping brackets 9A, 9B (see below); and iii) first and second clamping brackets 9A, 9B comprising respective first and second contact edges 11A, 11B for applying gripping force to the workpiece W. As shown, the first and second contact edges 11A, 11B are relatively thin, and formed from a resiliently deformable material such as a spring steel foil. They are supported in a cantilever fashion from respective compliant top plates 10A, 10B, and the thinness of the contact edges 10A, 10B is such that they are substantially co-planar with the upper surfaces of the respective top plates, so that during a printing operation, a print head may be passed over the top plates and contact edges without experiencing a noticeable discontinuity in height, which could adversely affect the printing operation. In the embodiment shown, the top plates 10A, 10B are connected to respective first and second mid-blocks 17A, 17B of the clamping brackets 9A, 9B via bearings 13, so that they may move laterally (i.e. along the Y-axis shown) with respect to the mid-blocks 17A, 17B. This lateral movement is useful if the workpiece support and gripping assembly 1 has snugging functionality, in which a workpiece is gripped by applying a lateral force (i.e. along the Y axis as shown) to its side edges via first and second snugging surfaces, as will be described in more detail below. However, if the workpiece support and gripping assembly 1 only has top-clamping functionality, in which a workpiece is gripped by applying a downward clamping force to a top surface of the workpiece via the first and second contact edges 11A, 11B, then the top plates 10A, 10B and respective mid-blocks 17A, 17B can be integrally formed, or at least without permitting such lateral movement.

All three of these components are vertically moveable (i.e. along the Z-axis shown) with respect to the other components, with the first and second support brackets being connected to the first and second rails 6A, 6B via bearings 16, and the first and second rails 6A, 6B being connected to the first and second clamping brackets 9A, 9B via bearings 15. Tooling table 2 and engagement member 3 are not directly connected to the first and second support brackets 5A, 5B, the first and second rails 6A, 6B or the first and second clamping brackets 9A, 9B. An actuator (not shown), preferably comprising an electric motor but alternatively a pneumatic actuator could be used, is provided to independently drive the tooling table 2 in a vertical direction, i.e. along the Z-axis shown. At least one other actuator (not shown), preferably one or more comprising electric motors but alternatively one or more pneumatic actuators could be used, is provided to independently drive the first and second rails 6A, 6B in a vertical direction, i.e. along the Z-axis shown. Furthermore, the workpiece support and gripping assembly 1 includes respective pneumatic actuators (not shown) which are operative to provide top-clamping force in the downward direction to the first and second clamping brackets, as described in more detail below. These pneumatic actuators may conveniently be located at the first and second rails 6A, 6B. In addition, actuators (not shown)

are also provided to laterally move the contact edges 11A, 11B during snugging operations. All of these actuators are controlled by a control system (not shown), which may be constituted by a computer, processor or other processing means running suitable embedded or downloadable software.

In addition to the hard stops 8 limiting the minimum distance in the vertical or Z direction shown between the first and second rails 6A, 6B and respective first and second clamping brackets 9A, 9B, a compression spring 14 is located between each of the respective first and second rails 6A, 6B and respective first and second clamping brackets 9A, 9B, which acts to bias the first and second clamping brackets 9A, 9B downwardly with respect to the first and second rails 6A, 6B.

As described so far, the apparatus is similar to that currently used in printing machines manufactured by the Applicant.

In accordance with the present invention, a measurement device for measuring the position along the Z-axis of the first and second clamping brackets 9A, 9B relative to the first and second rails 6A, 6B is provided. As shown, the measurement device comprises a magnetic encoder 12, which is provided at each of the first and second rails 6A, 6B. This is operative to provide positional feedback to the control system and thus control of the positions of the contact edges 11A, 11B along the Z axis.

In FIG. 1, the workpiece support and gripping assembly 1 is shown in an initial configuration, in which a workpiece W has just been loaded onto first and second conveyors 7A, 7B from an input transport system. The tooling table 2 and engagement member 3 supported thereon are at a retracted vertical position, which is the lowest vertical position throughout the following gripping process. The first and second support brackets 5A, 5B are supported by the first and second rails 6A, 6B, but not in contact with the tooling table 2. The first and second clamping brackets 9A, 9B are biased by the compression springs 14 down onto the hard stops 8 of the first and second rails 6A, 6B.

ii) Lifting to Pick Up Support Brackets

Figure 2:
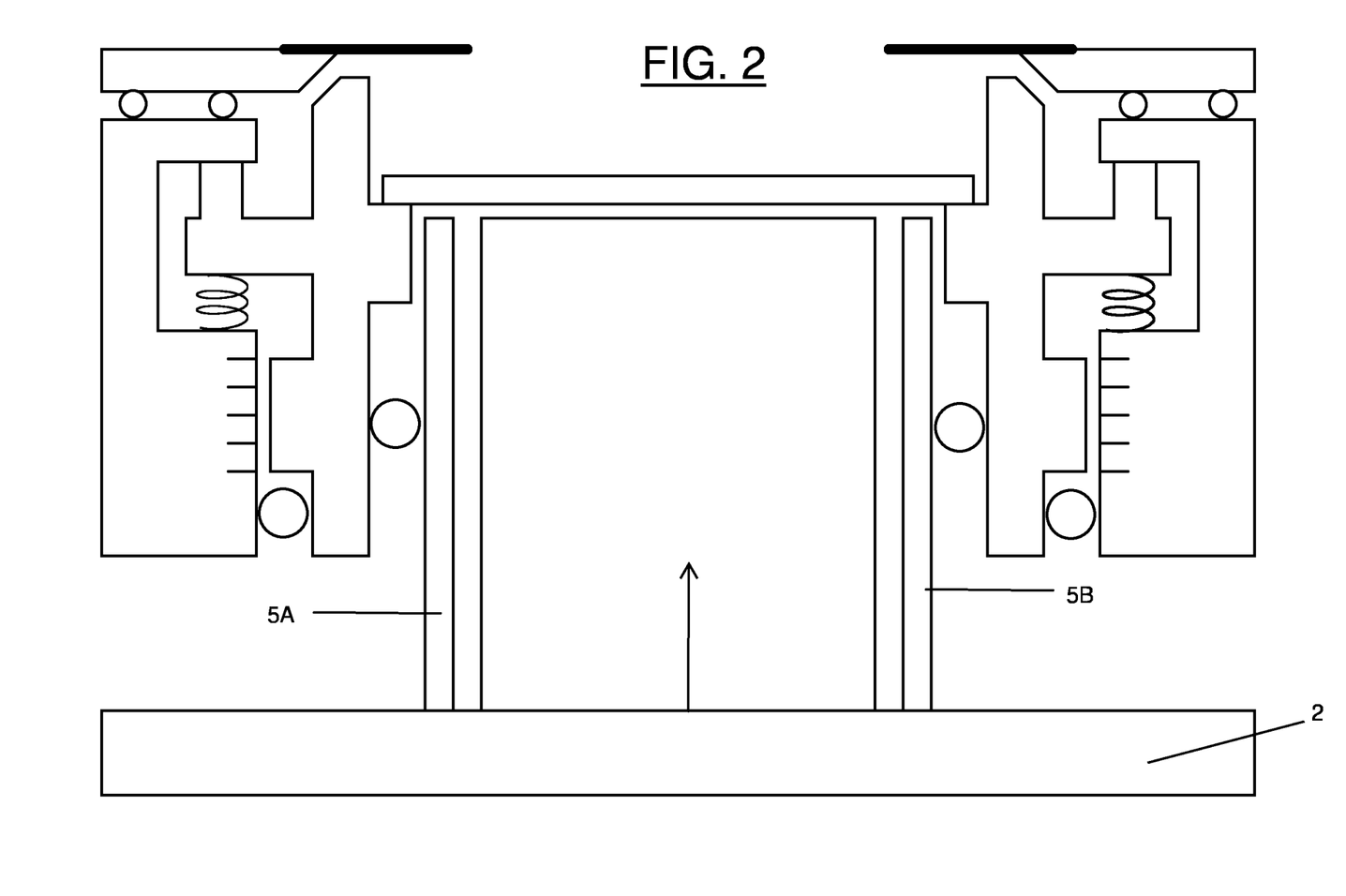

In the next stage of the gripping process, schematically shown in FIG. 2, the tooling table 2 is caused by the control system to move upwards, i.e. in the positive Z direction as shown by the arrow, to contact and then lift the first and second support brackets 5A, 5B, as it drives upwards.

iii) Lifting to Pick Up Workpiece

Figure 3:
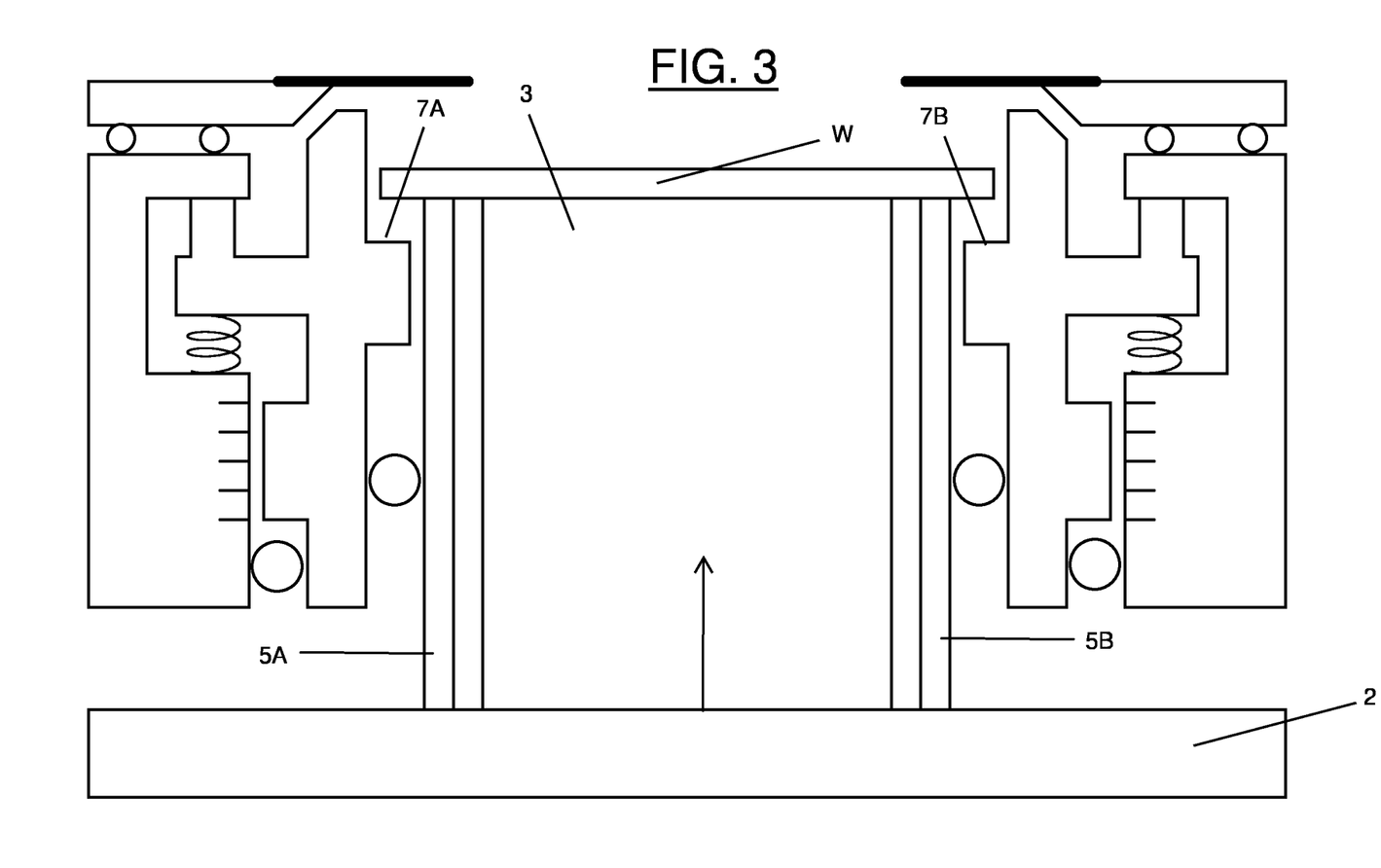

In the next stage of the gripping process, schematically shown in FIG. 3, the tooling table 2 continues to be driven upwards, so that the workpiece W is lifted off the first and second conveyors 7A, 7B by the first and second support brackets 5A, 5B and the engagement member 3.

iv) Lifting to Contact Edges

Figure 4:
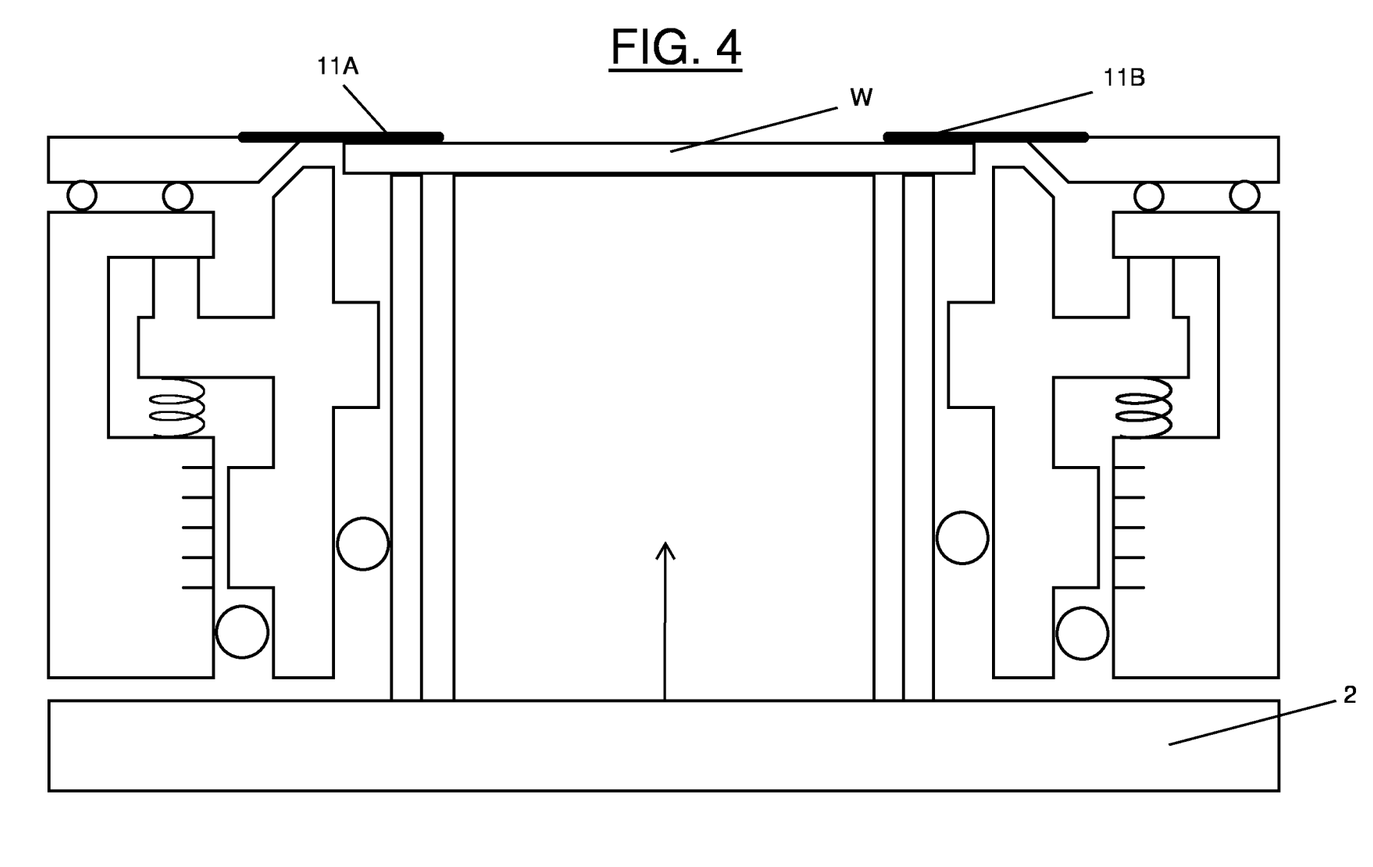

In the next stage of the gripping process, schematically shown in FIG. 4, the tooling table 2 continues to be driven upwards, in turn driving the upper surface of workpiece W into the undersides of the first and second contact edges 11A, 11B. The magnetic encoder 12 is used to monitor the position of the first and second clamping brackets 9A, 9B relative to the first and second rails 6A, 6B, and this position information is passed to the control system.

v) Overdriving and Position Measurement

Figure 5:
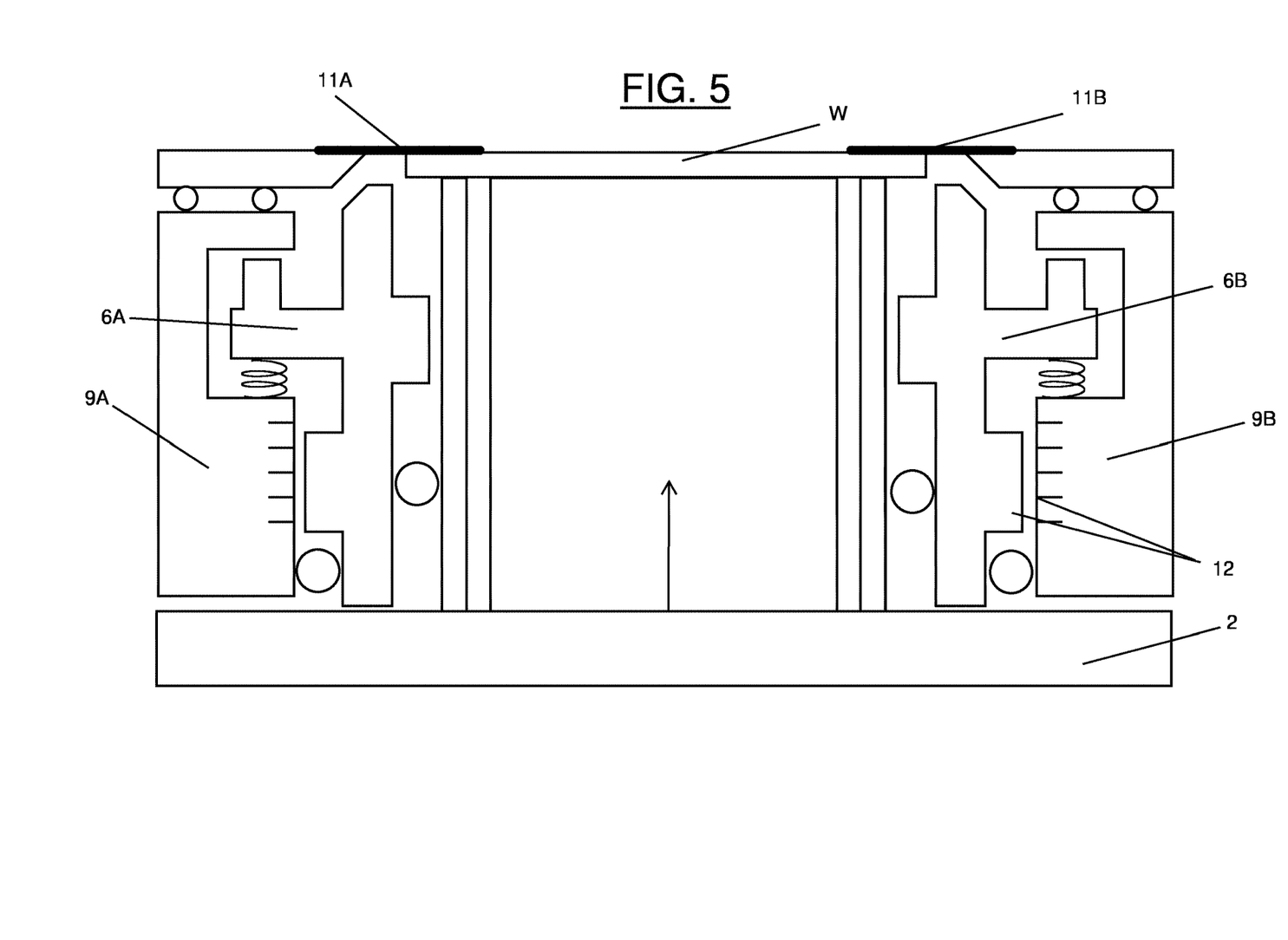

In the next stage of the gripping process, schematically shown in FIG. 5, upward driving of the tooling table 2 continues, so that the workpiece W is overdriven into the first and second contact edges 11A, 11B. The overdriven distance, i.e. the distance by which the tooling table 2 is raised after the workpiece W is brought into abutment with the first and second contact edges 11A, 11B (as shown in FIG. 4), is predetermined based on the workpiece W thickness tolerance. In more detail, the overdriving distance is set to be that distance which is sufficient to clamp the "thinnest allowable workpiece" while leaving a gap (i.e. a "clamping gap") above the hard stops 8 to the first and second clamping brackets 9A, 9B. The "thinnest allowable workpiece" is one of the nominal thickness minus the thickness tolerance, i.e. 10% of the nominal thickness in accordance with IPC specification 4101C or its successors, depending on the base material of the workpiece. As shown, the overdriving causes the first and second clamping brackets 9A, 9B to be lifted up, and away from the first and second rails 6A, 6B, creating a gap above the hard stops 8 to the first and second clamping brackets 9A, 9B. The overdriving itself is controlled by the control system using position information obtained from the magnetic encoder 12, which monitors the new position of the first and second clamping brackets 9A, 9B relative to the first and second rails 6A, 6B, i.e. the distance moved, with this position information being passed to the control system.

vi) Top Clamping Pressure and Remeasurement of Position

Figure 6:
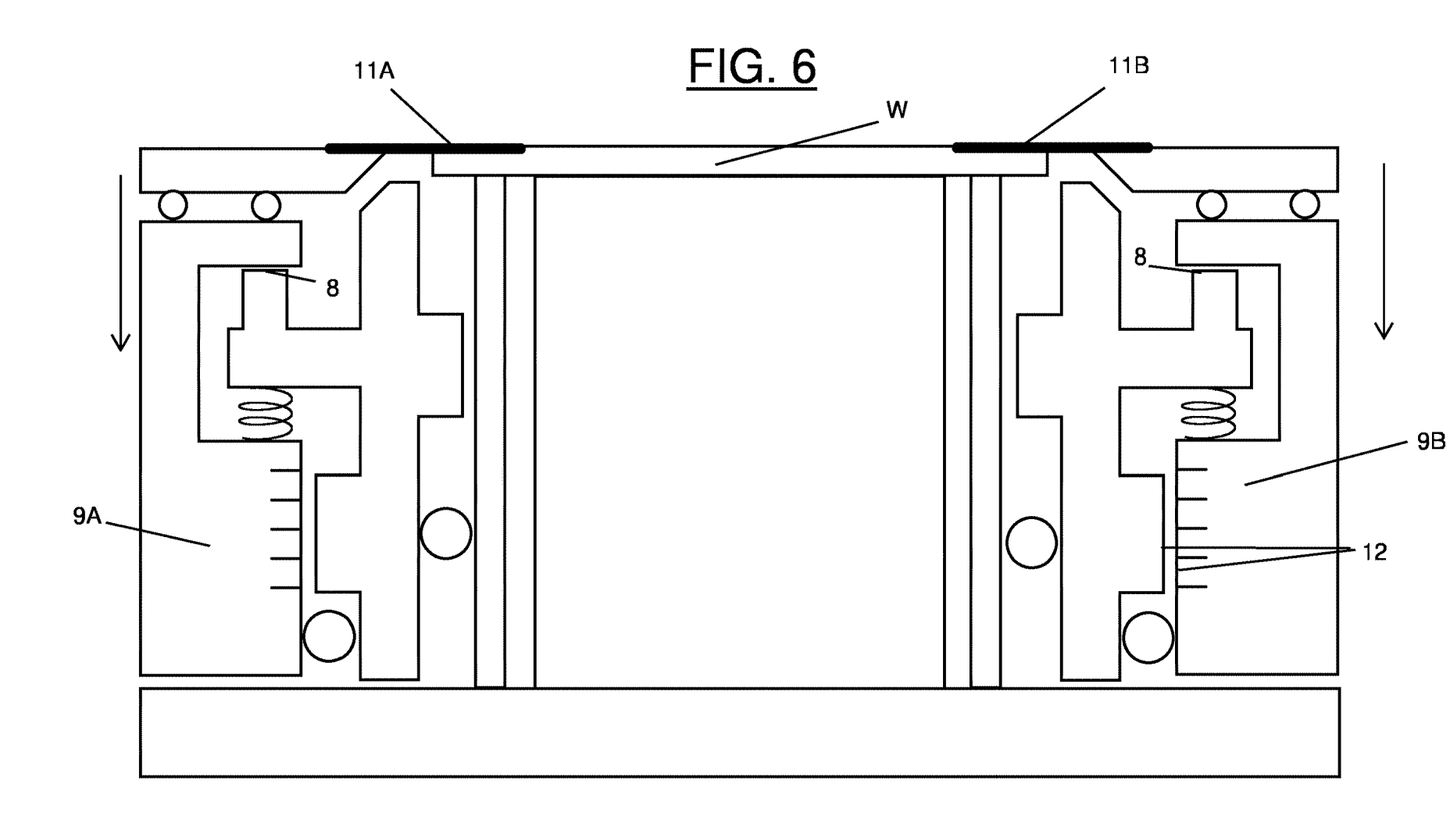
Figure 7:
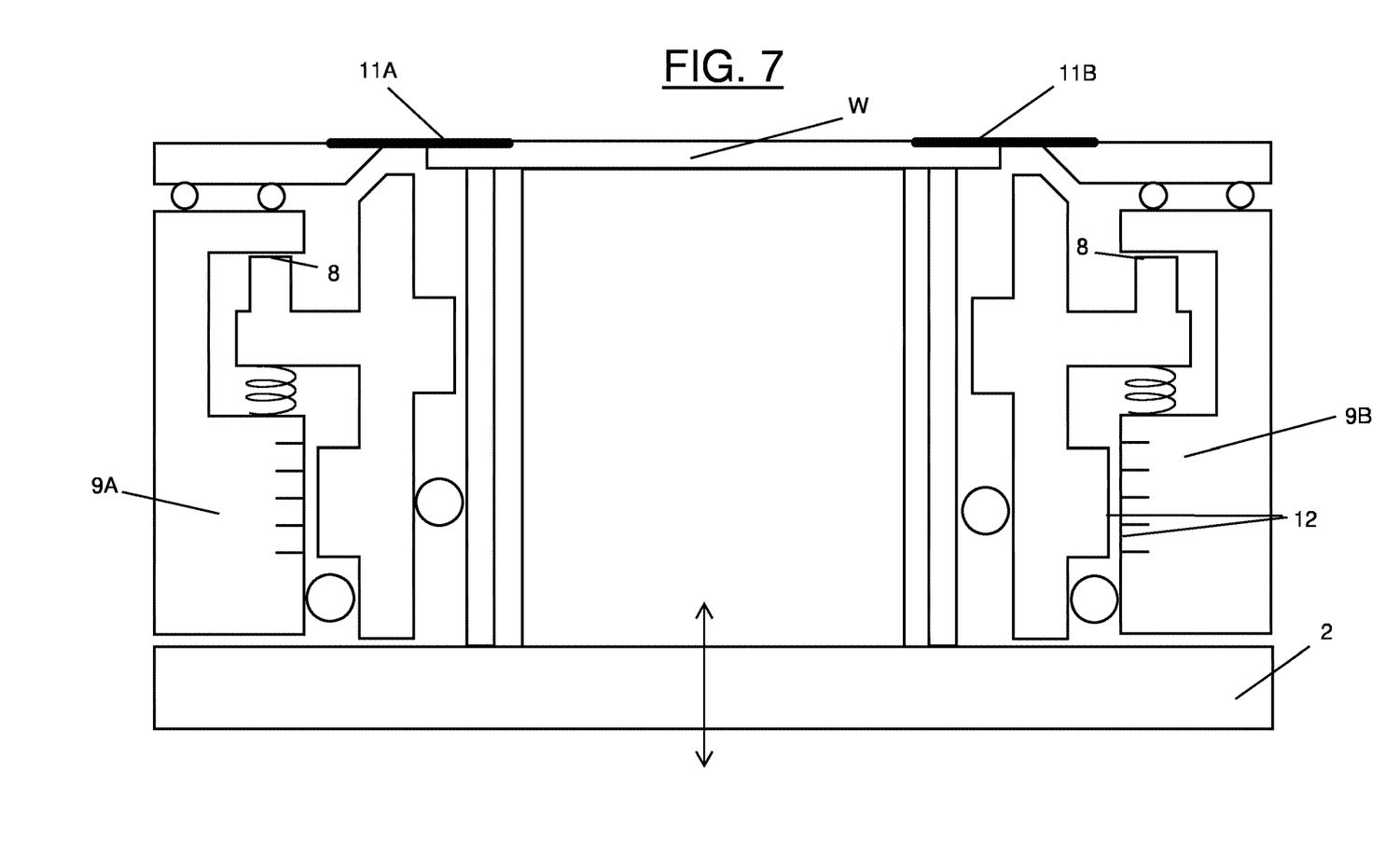

In the next stage of the gripping process, schematically shown in FIG. 6, top clamping pressure is applied. The pneumatic actuators are caused to operate by the control system to drive the first and second clamping brackets downwards, i.e. in the negative Z direction shown by the arrows, so that the workpiece W is securely gripped or clamped between the first and second contact edges 11A, 11B and the first and second support brackets 5A, 5B. Following application of this top clamping pressure, it should be noted that the first and second clamping brackets 9A, 9B are supported through the workpiece W, and not through the hard stops 8, in other words a gap is present between the hard stops 8 and the first and second clamping brackets 9A, 9B. The magnetic encoder 12 is again used to monitor the new position of the first and second clamping brackets 9A, 9B relative to the first and second rails 6A, 6B, i.e. the distance moved, and this position information is passed to the control system. It should be noted that the downward pressure applied is predetermined and constant for each workpiece to be gripped, and set to a pressure which would provide optimum clamping for a correct or optimum thickness workpiece. Due to the reaction between the workpiece W and the first and second contact edges 11A, 11B, if the workpiece W being clamped is thinner than optimum, the ensuing downward movement of the first and second clamping brackets 9A, 9B will be greater than expected, while if the workpiece W is thicker than optimum, the ensuing downward movement of the first and second clamping brackets 9A, 9B will be smaller than expected.

vii) Compensation Movement of Tooling Table

As set out above, position information of the first and second clamping brackets 9A, 9B relative to the first and second rails 6A, 6B is obtained following both overdriving and then following clamping. The difference between these obtained measurements may then be determined by the control system so that the workpiece thickness is determined. Should the control system determine that a workpiece is too thick or too thin to allow satisfactory printing, then the workpiece W may be discarded at this point, although, as set out with respect to step viii) below, it may be possible to still accommodate such workpieces through that additional and optional step in the process. If however the workpiece W has a thickness between these extremes, then any variations in thickness away from its nominal thickness may be compensated by moving the tooling table 2 up or down along the Z-axis by an amount corresponding to the variation, to compensate for the variation and bring the upper surface of the workpiece W to a predetermined optimum height relative to the first and second top plates 10A, 10B for a subsequent printing operation.

viii) Optional Lifting of Rails

Figure 8:
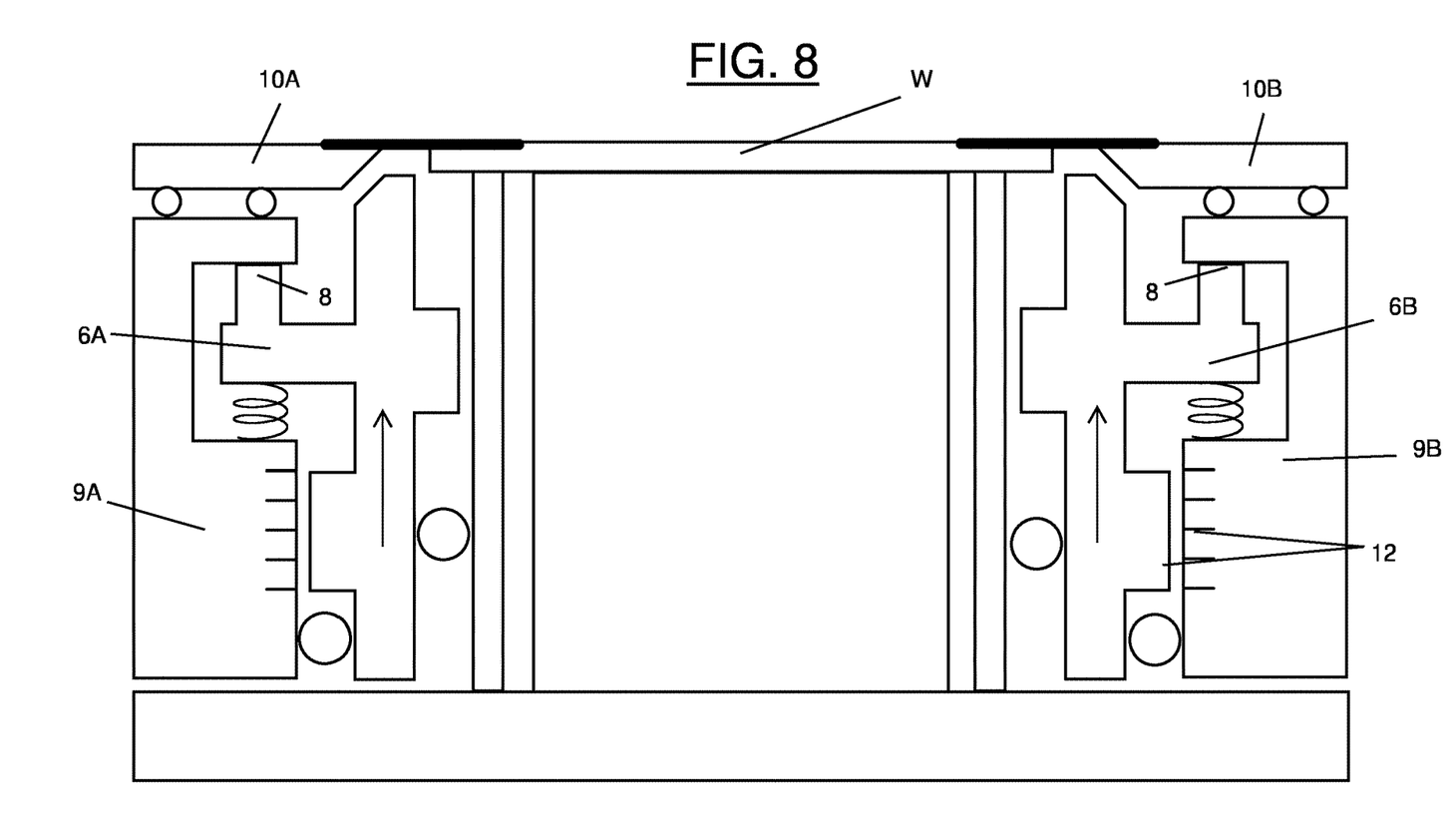

The next stage of the gripping process, schematically shown in FIG. 8, is optional, and only performed if the process state following the previous step results in an inadequate clamping gap, which may be the case if the thickness of the workpiece W is determined by the control system to be either too thick or too thin for satisfactory printing as set out in the discussion of the previous step. In this optional step, the first and second rails 6A, 6B are driven vertically upwards, along the positive Z direction as shown by the arrows, to a known reference position, so that the hard stops 8 are moved closer to, but still not in contact with, the first and second clamping brackets 9A, 9B. This is advantageous since it ensures that if the first and second clamping brackets 9A, 9B may only be deflected downwards a very small amount during a subsequent printing operation, in which a print head may exert considerable downward force onto the top plates 10A, 10B. This driving is controlled by the control system using feedback from the magnetic encoders 12.

It will be appreciated by those skilled in the art that the steps outlined above of overdriving the tooling table 2 by a predetermined distance based on the workpiece thickness tolerance, and measuring the relative positions of the first and second rails 6A, 6B and first and second clamping brackets 9A, 9B following overdriving and the subsequent application of top clamping pressure, then controlling lifting of the first and second rails 6A, 6B in dependence of these measured positions enables variations in thickness of the workpiece to be compensated within the gripping process.

The above-described process uses top-clamping only. However, snugging-only, or indeed combined top-clamping and snugging systems can also be operated in a similar manner in accordance with the present invention. For example, with a snugging-only process, the steps outlined above with respect to FIGS. 1 to 6 are unchanged, so that the thickness of the workpiece W is measured and compensated for in a similar way. However, following these steps, at least one rail 6A, 6B is moved towards the other rail 6B, 6A so that the first and second snugging surfaces 18A, 18B contact with side walls of the workpiece to apply a horizontal gripping force to the workpiece W from the side. Meanwhile, the first and second top plates 10A, 10B are then laterally retracted (i.e. along the Y-axis in a direction away from the workpiece W) to prevent their interference with a subsequent printing operation, optionally in combination with a lifting of the top plates 10A, 10B in the positive Z direction to avoid causing frictional damage to the workpiece W.

The above-described embodiments are exemplary only, and other possibilities and alternatives within the scope of the invention will be apparent to those skilled in the art. For example, while the present invention has been described above with particular reference to printing processes, the invention is not so limited. For example, the above-described clamping processes could be used for other processes, for example clamping a workpiece for use in a component placement process in a so-called pick-and-place machine, or indeed in a wide variety of other processes where clamping of a substantially planar workpiece is required.

REFERENCE NUMERALS USED

1—Workpiece support and gripping assembly
2—Tooling table
3—Engagement member
4—Engagement member upper surface
5A, 5B—First and second support brackets
6A, 6B—First and second rails
7A, 7B—First and second conveyors
8—Hard stop
9A, 9B—First and second clamping brackets
10A, 10B—First and second top plates
11A, 11B—First and second contact edges
12—Magnetic encoder
13, 15, 16—Bearings
14—Compression spring
17A, 17B—First and second mid-blocks
18A, 18B—First and second snugging surfaces
W—Workpiece

The invention claimed is:

1. A method of gripping a substantially planar workpiece, comprising the steps of:
  i) providing a workpiece support and gripping assembly including the following components:
    tooling comprising a tooling table and at least one engagement member, the at least one engagement member having an upper surface adapted to support the underside of a workpiece,
    first and second rails comprising respective first and second conveyors for receiving a workpiece from a transport system, and
    first and second clamping brackets comprising respective first and second contact edges for applying gripping force to the workpiece,
    all of these components being vertically moveable relative to one another;
  ii) locating the workpiece on the first and second conveyors with the tooling therebelow;
  iii) raising the tooling table such that the workpiece is lifted off the first and second conveyors and into contact with an underside of the first and second contact edges; and
  iv) applying a downward force to the workpiece via the first and second contact edges,
    wherein in step iii), following contacting of the workpiece and the first and second contact edges, the tooling table is overdriven in an upwards direction to lift the first and second clamping brackets away from the first and second rails.

2. The method of claim 1, wherein in step iii) the tooling table is overdriven in an upwards direction by a predetermined distance.

3. The method of claim 2, wherein the overdriving by the predetermined distance is controlled by measuring the relative vertical position of the first and second rails and the first and second clamping brackets.

4. The method of claim 1, wherein the downward force is pneumatically applied.

5. The method of claim 1, wherein the downward force is controlled by measuring the relative vertical position of the first and second rails and the first and second clamping brackets.

6. The method of claim 1, further comprising the step:
  v) raising or lowering the tooling table to bring the workpiece to a predetermined height.

7. The method of claim 6, wherein the raising or lowering of the tooling table is controlled by measuring the relative vertical position of the first and second rails and the first and second clamping brackets following step ii) and following step iv), comparing the measurements obtained, and raising or lowering the tooling table in dependence of the difference in the measurements.

8. The method of claim 1, further comprising the step:
vi) raising the first and second rails to a reference position, the raising controlled at least partially by measuring the relative vertical position of the first and second rails and the first and second clamping brackets.

9. The method of claim 1, wherein, at the conclusion of step ii), the first and second clamping brackets rest on respective portions of the first and second rails.

10. The method of claim 1, comprising biasing the first and second clamping brackets downwards towards the respective first and second rails.

11. The method of claim 1, wherein the downward force applied in step iv) is maintained following step iv) to grip the workpiece.

12. The method of claim 1, comprising the step, subsequent to step iv), of applying a horizontal gripping force to a lateral edge of the workpiece via at least one of the first and second rail, to grip the workpiece.

13. The method according of claim 1, for gripping a substantially planar workpiece within a printing machine to perform a printing operation thereon.

* * * * *